United States Patent [19]

Kuter

[11] 4,052,631

[45] Oct. 4, 1977

[54] ROTARY RECTIFIER DEVICE FOR ELECTRIC MACHINES

[75] Inventor: Heinrich Kuter, Wattenscheid, Germany

[73] Assignee: Kraftwerk Union Aktiengesellschaft, Mulheim (Ruhr), Germany

[21] Appl. No.: 664,050

[22] Filed: Mar. 4, 1976

[30] Foreign Application Priority Data

Mar. 17, 1975 Germany ............................ 2511636

[51] Int. Cl.² ............................................ H02K 11/00
[52] U.S. Cl. .................................... 310/68 D; 310/71
[58] Field of Search ............... 310/71, 72, 68 R, 68 D

[56] References Cited

U.S. PATENT DOCUMENTS 3,852,628   12/1974   Spisak et al. ....................... 310/68 D

*Primary Examiner*—Donovan F. Duggan
*Attorney, Agent, or Firm*—Herbert L. Lerner

[57] ABSTRACT

A rectifier device for a rotatable electrical machine includes a rotary shaft, a carrier wheel mounted on the shaft, a disc type rectifier, a first clamping member secured to the carrier wheel and disposed radially outwardly from the rectifier, the rectifier having one face mounted on the first clamping member, a second clamping member secured to the carrier wheel and disposed radially inwardly from the rectifier, and mounting means resiliently secured between the second clamping member and the other face of the rectifier to resiliently urge contact between the rectifier and the clamping members.

9 Claims, 3 Drawing Figures

ROTARY RECTIFIER DEVICE FOR ELECTRIC MACHINES

BACKGROUND OF THE INVENTION

1. Field of the Invention

This invention relates to a rotary rectifier device for rotatable electrical machines having disc-type rectifier cells which are resiliently clamped by mounting means at the inner periphery of an annular or ring flange of a carrier-wheel.

2. Description of the Prior Art

A heretofore known rotatable rectifier device of this type is described in Swiss Pat. No. 499,201. In that device, several series-connected disc cells are each held between a rigid and a resilient heat sink plate and are bolted together in a column at the inner periphery of a carrier-wheel ring flange.

Such known disc cells have considerable advantages over conventional rectifiers having a housing with an area contact and a stranded-wire lead on the opposite side, because they have smaller dimensions and less weight. Due to the symmetrical shape of the disc cells, it is also not necessary to construct each rectifier type in two different embodiment for the different cirections of conduction. However, difficulties arise with the assembly of such disc cells, since the required contact pressure must be supplied from the outside, whereby the contact pressure must be distributed uniformly over the surfaces, and any possible deviation of the contact surfaces from plane-parallelism must be balanced or equalized by the clamping action. To make inspection measurements possible, he contact pressure must not fall below a predetermined minimum when the machine is standing still. On the other hand, during operation of the machine, the centrifugal force acting on the parts of the clamping system should reach a value no greater than a permissible value.

In the device of the aforementioned Swiss patent, however, these conditions are inadequately fulfilled. The resilient heat sink plates have only very short spring travel distance, so that considerable change can occur from the intended value of the contact pressure in the event of minor dimensional changes of parts of the clamping system, such as, for example, due to shrinking of insulation parts. For the same reason, there is no sufficiently uniform pressure distribution over the contact surfaces of the disc cell, particularly if the latter have minor deviations from plane-parallelism. The heat sinks and the spring elements are clamped in one operation, where the degree of tightening can have an additional uncontrollable influence on the magnitude of th contact pressure. A further disadvantage is that the individual parts can be assembled and adjusted only directly at the machine.

SUMMARY OF THE INVENTION

It is therefore an object of the invention of the instant application to provide a rotary rectifier device for use with rotatable electrical machines which is easy to install and in which the correct contact pressure is automatically obtained in the assembly without special adjustment work and without the disadvantages of corresponding prior art devices hereinbefore described.

With the foregoing and other objects in view there is provided in accordance with the invention a rectifier device for a rotatable electrical machine comprising a rotary shaft, a carrier wheel mounted on the shaft, a disc type rectifier, a first clamping member secured to the carrier wheel and disposed radially outwardly from the rectifier, the rectifier having one face mounted on the first clamping member, a second clamping member secured to the carrier wheel and disposed radially inwardly from the rectifier, and mounting means resiliently secured between the second clamping member and the other face of the rectifier to resiliently urge contact between the rectifier and the clamping members.

In accordance with another feature of the invention, the carrier wheel includes a peripheral flange, and means for securing the first and second clamping members to the peripheral flange.

In accordance with a further feature of the invention, the means for securing the first and second clamping members includes threaded bolts secured to the flange, and means for electrically insulating the first and second clamping members.

In accordance with still another feature of the invention, the machine includes an electrical terminal and a flexible lead is connected between the terminal and the second clamping member, the resilient mounting means urging the lead into contact with the other face of the rectifier.

In accordance with a still further feature of the invention, the resilient mounting means includes a compression spring.

In accordance with yet another feature of the invention, the first clamping member provides a heat sink.

In accordance with an additional feature of the invention, a contact plate is included between the other face of the rectifier and one side of the lead, and there is a pressure member between the other side of the lead and the compression spring.

In accordance with another additional feature of the invention, the pressure member includes a cylindrical extension and the compression spring is dipsosed around the extension.

In accordance with a further additional feature of the invention, there are included means removably secured to the second clamping member for adjusting the compression of the spring.

As another added feature of the invention, the second clamping member includes an opening around the cylindrical extension, the means removably secured to the second clamping member including a screw extending through the opening and adjustably extending through the opening and adjustably engaging the cylindrical extension.

Other features which are considered as characteristic for the invention are set forth in the appended claims.

Although the invention is illustrated and described herein as embodied in a rotary rectifier device for electrical machines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

DESCRIPTION OF THE PREFERRED EMBODIMENT

Figure 1:
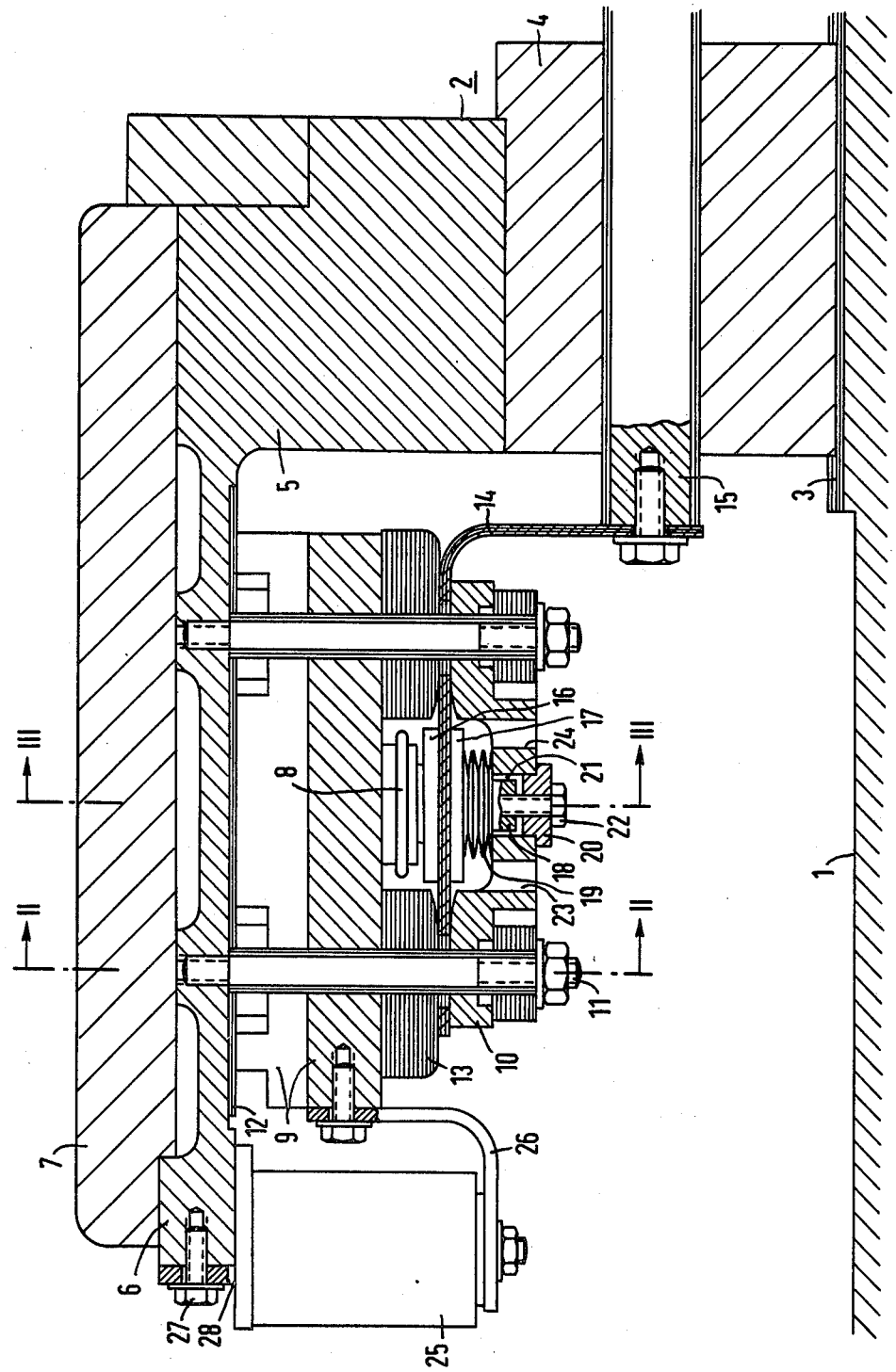
FIG. 1 shows a longitudinal partial cross-sectional view of a rectifier carrier wheel including the disc-type cell in accordance with the invention of the instant application.

Referring now to the drawing a particularly to FIG. 1, thereof, there is shown a rectifier carrier wheel 2 for one direct-current polarity fastened on the rotary shaft 1 of an electrical machine. The carrier wheel 2 includes an intermediate ring 4 of non-magnetic material which is mounted on and separated from shaft 1 by insulation 3, and the main hub 5 of the carrier wheel 2, which is shrunk onto the ring 4 without insulation. The hub 5 is constructed in one piece with a ring or annular flange 6 for holding and accommodating all components of the rectifier device. A ring cap 7 of constant cross-section and high-strength material is shrunk onto the ring flange 6 to provide increased strength. Another carrier wheel, not shown, which provides the other d-c polarity, is disposed on shaft 1 back-to-back with the carrier wheel 2 in the same manner.

Figure 2:
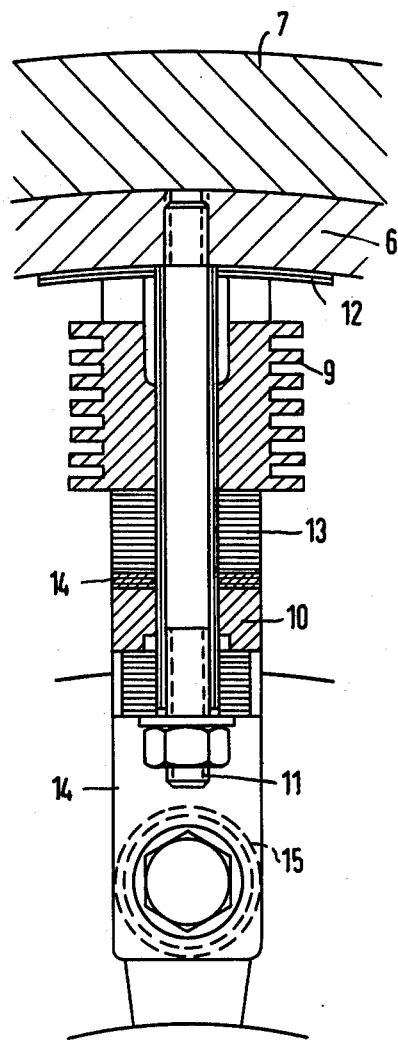
FIG. 2 is a partial cross-sectional view of a carrier wheel segment taken along the line II—II in FIG. 1.
Figure 3:
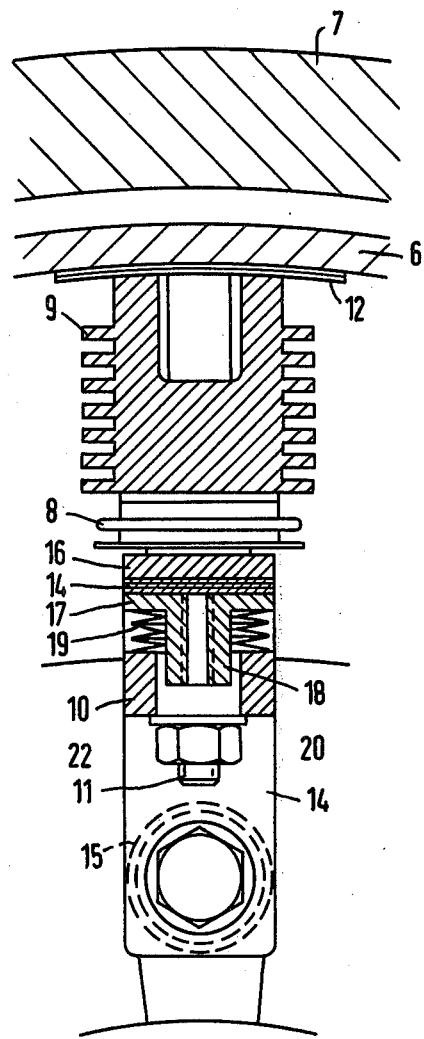
FIG. 3 is a partial cross-sectional view of a carrier wheel segment in the vicinity of a disc cell with the assembly fixture portion removed, as taken along the line III—III in FIG. 1.

As may also be seen from the cross-sectional views of FIGS. 2 and 3, a disc-type rectifier cell 8 is inserted between an outer radially disposed clamping element 9 and an inner radially disposed clamping element 10. The fastening and bracing of the clamping elements 9 and 10 is accomplished by means of screw bolts 11, which are screwed into the carrier-wheel ring flange 6. An insulating layer 12 is inserted between the outer clamping element 9 and the ring flange 6, and an insulating spacer 13 between the two clamping elements 9 and 10 so that the clamping elements 9 and 10 and the ring flange 6 are insulated from each other. A flexible three-phase connecting lead 14 is firmly clamped between the insulating spacer 13 and the inner clamping element 10. The lead 14 is connected at its other end with the three-phase post 15 extending through and insulated from the non-magnetic intermediate ring 4. This flexible connecting lead 14 has a contact plate 16 on one side adjacent the disc cell 8 and a pressure piece 17 with a threaded cylindrical extension 18 on the other side. Elements 16 and 17 are secured about lead 14 by screw-bolts 11. Disposed between the pressure piece 17 and the inner clamping element 10, is a compression spring in the form of a stack of cup springs 19, which supplies the necessary contact pressure for the disc cell 8. This stack of cup springs 19 is constructed to assure the necessary contact pressure that is required for testng if the machine is standing still. In operation, when the machine is rotating, the contact pressure merely increases according to the centrifugal force applied by the contact plate 16 and the pressure piece 17 as well as of part of the connecting lead 14. Small dimensional deviations and changes, which may be caused, for example, by the shrinking of insulting parts, hardly affect the magnitude of the contact pressure because of the large spring travel distance available for the stack of cup springs 19.

For better adjustment of the individual components during assembly, the following simple adjustable assembly fixture is provided:

As shown in FIG. 1, a screw 22 with a washer 20 is inserted into a central hole 21 of the inner clamping element 10 and screwed into the threaded cylindrical extension 18 of the pressure piece 17. The inner clamping element 10, the connecting lead 14 with the contact plate 16, and the pressure piece 17 as well as the stack of cup springs 19, are thus fixed in the correct relative position and can therefore be installed as a structural unit. The stack of cup springs is thereby heavily pretensioned, with the pretension being limited by the threaded extension 18 of the pressure piece 17 coming to a stop against the washer 20. Due to this pretension, the diode 8 can initially be inserted with play. The screw bolts 11 are then tightened with the prescribed torque without interference from the spring system. After the temporarily assembled screw 22 and the washer 20 are removed, the stack of cup springs 19 assumes its permanent function to ensure the required contact pressure between the disc cell 8 and the outer clamping element 9 on one side and the contact plate 16 of the three-phase connecting lead 14 on the other side.

The screw bolts 11 thus have a dual function, because they serve both as fastening and supporting elements. In comparison with constructions having separate fastening and bracing bolts, the device of the invention in the instant application provides space savings permitting an optimal utilization of the space available at the ring flange.

In the embodiment shown, only a single disc cell 8 is provided for each heat sink 9. However, several such disc cells can also be arranged in a similar manner one behind the other in the axial direction.

The inner clamping element 10 also includes radial ventilating holes 23 and 24, which provide effective cooling of the connecting lead 14, contact plate 16, and the pressure piece 17, as well as the side of the disc cell adjacent the outer clamping element 9 which does not rest against the heat sink proper.

As a further addition, a fuse 25 is disposed between the current-carrying heat sink 9 and the outer flange ring 6 which forms one d-c pole. The fuse is conneted to the heat sink 9 via a strap 26 and to the outermost axial end of the flange ring 6 via a screw 27 and a corresponding boss 28.

What is claimed is:

1. A rectifier device for a rotary electrical machine having an electric terminal, comprising:
   a rotary shaft;
   a carrier wheel mounted on said shaft;
   a disc type rectifier;
   a first clamping member secured to said carrier wheel and disposed radially outward from said rectifier, said rectifier having a pair of faces and being mounted by one of said faces on said first clamping member;
   a second clamping member secured to said carrier wheel and disposed radially inwardly from said rectifier;
   mounting means resiliently secured between said second clamping member and the other face of said rectifier to resiliently urge contact between said rectifier and said clamping members, and a flexible lead connected between the terminal of the machine and said second clamping member, said resilient mounting means urging said lead into contact with said other face of said rectifier.

2. The device of claim 1 wherein said carrier wheel includes a peripheral flange, and means for securing said first and second clamping members to said peripheral flange.

3. The device of claim 2 wherein said means for securing said first and second clamping members includes threaded bolts secured to said flange, and means for electrically insulating said first and second clamping members.

4. The device of claim 1 wherein said resilient mounting means includes a compression spring.

5. The device of claim 4 wherein said first clamping member provides a heat sink.

6. The device of claim 4 including a contact plate between said other face of said rectifier and one side of said lead, and a pressure member between the other side of said lead and said compression spring.

7. The device of claim 6 wherein said pressure member includes a cylindrical extension, and said compression spring is disposed around said extension.

8. The device of claim 7 including means removably secured to said second clamping member for adjusting the compression of said spring.

9. The device of claim 8 wherein said second clamping member includes an opening around said cylindrical extension, said means removably secured to said second clamping member including a screw extending through said opening and adjustably engaging said cylindrical extension.

* * * * *